United States Patent [19]
Lee et al.

[11] Patent Number: 5,726,932
[45] Date of Patent: Mar. 10, 1998

[54] TRENCH FREE SRAM CELL STRUCTURE

[75] Inventors: Jin-Yuan Lee; Jenn-Ming Huang; Ming-Chih Chung, all of Hsin-chu, Taiwan

[73] Assignee: Taiwan Semiconductor Manufacturing Company, Ltd., Hsin-chu, Taiwan

[21] Appl. No.: 663,577

[22] Filed: Jun. 13, 1996

[51] Int. Cl.[6] .................................................. G11C 11/00
[52] U.S. Cl. .......................... 365/154; 365/156; 257/903; 257/290
[58] Field of Search ............................. 365/154, 156, 365/190; 257/903, 290, 273

[56] References Cited

U.S. PATENT DOCUMENTS

| | | | |
|---|---|---|---|
| 4,933,899 | 6/1990 | Gibbs | 365/190 X |
| 5,243,555 | 9/1993 | Youn et al. | 365/154 |
| 5,301,146 | 4/1994 | Hama | 365/154 |
| 5,570,312 | 10/1996 | Fu | 365/154 |

OTHER PUBLICATIONS

S. Wolf, "Silicon Processing in the VLSI Era—vol. 2" Lattice Press, Sunset Beach, CA, 1990, pp. 160–162.

*Primary Examiner*—David C. Nelms
*Assistant Examiner*—Huan Hoang
*Attorney, Agent, or Firm*—George O. Saile; Stephen B. Ackerman; Graham S. Jones, II

[57] ABSTRACT

An SRAM transistor cell on a doped semiconductor substrate comprises a first pass transistor and a second pass transistor, a first driver transistor and a second driver transistor and a saturated mode transistor. The device includes a first and second load resistor, first second and third nodes, a bit lines and interconnection lines. The first driver transistor drain region is connects to the first node. The control gate electrode cross connects via the first interconnection line to the second node. The second driver transistor drain region connects to the third node and the control gate electrode cross connects via the second interconnection line to the first node. The control gate electrodes of the pass transistors connect to a single input line. The drain region of the first pass transistor connects to the first node. The drain region of the second pass transistor connects to the second node. The source region of the first pass transistor connect to the bit line bar. The source region of the second pass transistor is connects to the bit line. The drain region and control gate electrode of the saturated mode transistor connect to the second node and the source region of the saturated mode transistor connects to the third node.

20 Claims, 5 Drawing Sheets

TRENCH FREE SRAM CELL STRUCTURE

BACKGROUND OF THE INVENTION

1. Field of the Invention

This invention relates to SRAM devices and more particularly to electrical contact between the polysilicon control gate electrode and the doped silicon substrate.

2. Description of Related Art

Butted Contact

As used in this application, in VLSI semiconductor devices a "butted contact" exists where a polysilicon conductor and the substrate edges butt up against one another, but do not actually make electrical contact. Usually the polysilicon conductor is separated from the substrate by an oxide (silicon dioxide) layer, which comprises a dielectric (insulator), even when the contact window is opened. Then another polysilicon conductor is then deposited through the contact window into contact with the substrate at the same time that it contacts the polysilicon conductor to provide an interconnection between the polysilicon and the substrate.

Buried Contact

In the case of a "buried contact" direct contact can be made between polysilicon and the substrate, eliminating the need for a metal film to form the interconnection. For example, a window can be opened in the thin gate oxide over the substrate area at which the contact is to be established. Then a layer of polysilicon is deposited forming a direct contact with the substrate only through the window because the remainder of the polysilicon which is formed over an insulating or dielectric layer such as a gate oxide layer or a field oxide (FOX) structure. The insulating or dielectric layer provides electrical separation from the substrate. An ohmic contact is formed where the poly-silicon-to-substrate Si interface is formed by the diffusion into the substrate of dopant present in the polysilicon, forming an excellent contact between the polysilicon and the silicon substrate.

Ultimately an insulating film (silicon dioxide) is formed over the "buried contact." With a "buried contact" covered by such an insulating film, a metal layer can cross over the insulating film above the "buried contact" without making an electrical connection to it because of the protection provided by the insulating film.

Buried contacts provide the advantage in devices with polysilicon gates of providing an additional level on which electrical interconnections can be made between devices formed on the semiconductor substrate. This additional level allows circuit connections to be formed before the metal layer is deposited, and permits flexibility in making interconnections between devices on the substrate.

Problem with Buried Contacts in SRAMS

While buried contacts are known in SRAMs, in the process of manufacture of SRAM devices, trenches formed to provide buried contacts usually result in unacceptable resistance values. Another problem is that resistance values are unstable in the charge/discharge current paths. This causes unstable chip probe yield or small low supply voltage Vcc margins.

SUMMARY OF THE INVENTION

In accordance with this invention a four transistor polysilicon load SRAM cell structure has been modified to include an additional transistor connecting a pair of charge nodes with a combination of a butted contact and buried contacts to link components of the SRAM cell, overcoming the problem of buried contacts in trenches without requiring any extra processing steps in an SRAM manufacturing process.

An SRAM transistor cell on a doped semiconductor substrate comprises a first pass transistor and a second pass transistor, each having a source region, a drain region and a control gate electrode. Each of a first driver transistor and a second driver transistor each has a source region, a drain region and a control gate electrode. A saturated mode transistor has a source region, a drain region and a control gate electrode. The device includes a first load resistor and a second load resistor, a first node, a second node and a third node, a bit line and a bit line bar, and first and second interconnection lines. The first driver transistor has the drain region thereof connected to the first node and the control gate electrode cross-connected via the first interconnection line to the second node. The second driver transistor has the drain region thereof connected to the third node and the control gate electrode cross-connected via the second interconnection line to the first node. The control gate electrodes of the pass transistors are connected to a single input line. The drain region of the first pass transistor connects to the first node. The drain region of the second pass transistor connects to the second node. The source region of the first pass transistor connects to the bit line bar. The source region of the second pass transistor connects to the bit line. The drain region and control gate electrode of the saturated mode transistor connect to the second node. The source region of the saturated mode transistor connect to the third node.

The saturated mode transistor has an effective gate length<0.05 μm. All of the control gate electrodes are formed from a first layer of polysilicon. At the first node, the first resistor connects through a second polysilicon layer forming a buried contact to the source region of the first pass transistor and forming a butting contact to the control gate electrode of the second driver transistor. At the second node, the first resistor connects through a second polysilicon layer forming a buried contact to the source region of the second pass transistor and forms a butting contact to the control gate electrode of the first driver transistor. At a second node the first resistor connects through a second polysilicon layer forming a buried contact to the source region of the second pass transistor and forms a butting contact to the control gate electrode of the first driver transistor.

Preferably, the saturation mode transistor is formed by a POCl$_3$ junction at a drain region where the pattern of a first polysilicon layer has a positive extension less than about 0.2 μm with a buried contact to the substrate and a conventional source region.

An SRAM transistor cell includes a first pass transistor and second pass transistor. Each has a doped source region and a doped drain region in the substrate. A control gate electrode, part of a first polysilicon layer, is formed on a gate oxide layer on the substrate. a first driver transistor and a second driver transistor each has a doped source region in the substrate, a doped drain region in the substrate, and a control gate electrode formed from the first polysilicon layer formed on a gate oxide layer on the substrate.

A saturated mode transistor has a doped source region and a doped drain region in the substrate. A control gate electrode, part of the first polysilicon layer, is formed on a gate oxide layer on the substrate. There are first and second polysilicon load resistors, a first node, a second node and a third node, a bit line and a bit line bar, and first and second interconnection lines. The first driver transistor has the drain region thereof connected to the first node and the control gate electrode cross-connected via the first interconnection line to the second node. The second driver transistor has the drain region thereof connected to the third node and the control gate electrode cross-connected via the second interconnection line to the first node. The control gate electrode is formed from a first polysilicon layers of the pass transistors and connect to a single input line. The drain region of the first pass transistor connect to the first node. The drain region of the second pass transistor connect to the second node. The source region of the first pass transistor connects to the bit line bar. The source region of the second pass transistor connects to the bit line. The drain region and control gate electrode of the saturated mode transistor are connected to the second node and the source region of the saturated mode transistor are connected to the third node. The saturated mode transistor has an effective gate length<0.05 µm. All of the control gate electrodes are formed from a first layer of polysilicon doped with phosphorus (P31) with a dose between about $1\times10^{15}$ atoms/cm$^2$ and about $5\times10^{15}$ atoms/cm$^2$.

Preferably, the first node the first resistor connects through a second polysilicon layer forming a buried contact to the source region of the first pass transistor and forming a butting contact to the control gate electrode of the second driver transistor. At the second node the first resistor connects through a second polysilicon layer forming a buried contact to the source region of the second pass transistor and forming a butting contact to the control gate electrode of the first driver transistor.

The saturation mode transistor is formed by a POCl$_3$ junction formed by doping with phosphorus (P31) with a dose greater than about $1\times10^{15}$ atoms/cm$^2$ as a drain region where the pattern of a first polysilicon layer has a positive extension less than about 0.2 µm with a buried contact to the substrate and a conventional source region.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
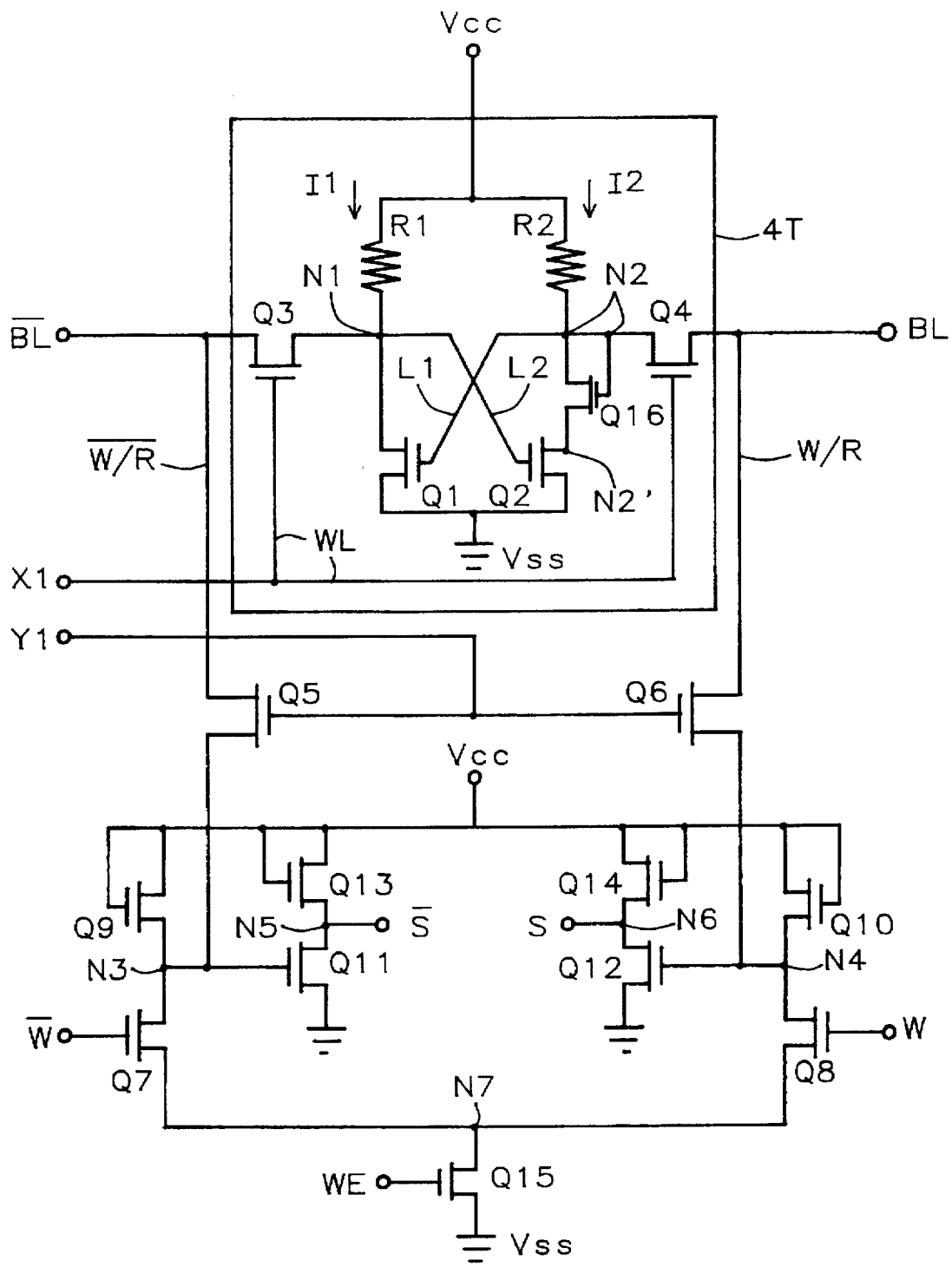
FIG. 1 shows an electrical schematic circuit diagram of an SRAM (Static Random Access Memory) in accordance with this invention.

FIG. 1 shows an electrical schematic circuit diagram of an SRAM (Static Random Access Memory) implementation of this invention which includes sixteen transistors comprising MOSFET transistors Q1, Q2, Q3, Q4, Q5, Q6, Q7, Q8, Q9, Q10, Q11, Q12, Q13, Q14, Q15, Q16. A new feature of this SRAM circuit in the saturated mode FET transistor Q16 which connects a pair of charge nodes N2, and N2'.

SRAM Circuit

FIG. 1 shows (within a box labelled 4T') a five transistor SRAM cell 4T' (which is a modified four transistor cell), in accordance with this invention. The cell 4T' includes cross-coupled pass (transfer) transistors Q3 and Q4 and driver transistors Q1 and Q2, plus a saturated mode transistor Q16, and a pair of load resistors R1, R2. In addition to the otherwise conventional four transistor structure of cell 4T' is the additional fifth transistor Q16. The saturated mode transistor Q16 has the advantage of very short effective gate length<0.05 µm which avoids introducing a significant additional resistance and thus avoids to large an IR voltage drop across the source/drain circuit of saturated mode transistor Q16.

Driver transistors Q1 and Q2 have their drain regions connected respectively to nodes N1 and N2 and their control gate electrodes cross-connected respectively via interconnection lines L1 and L2 to nodes N2 and N1. Pass transistors Q3 and Q4 have their control gate electrodes connected to input line X1. In addition, the SRAM cell of FIG. 1 includes two load resistors $R_1$ and $R_2$. Load resistor $R_1$ connects between node N1 and a terminal connected to source voltage Vcc. Node N1 connects to the drain region of transistor Q1. Load resistor R2 connects between source voltage Vcc and node N2 which connects to the S/D circuit of transistor Q16. The source/drain circuit of transistor Q16 connects between node N2 and node N2'. The control gate electrode of transistor Q16 connects to node N2. The drain region of transistor Q2 connects to node N2'. The source regions of transistors Q1 are Q2 are connected to Vss (ground level potential.)

Pass transistor Q3 and pass transistor Q4 have their control gate electrodes connected to line X1 and their S/D circuits respectively connected between node N1 and bit line BL-bar for transistor Q3 and node N2 and bit line BL for transistor Q4. The drain region of pass transistor Q3 connects to node N1. The drain region of pass transistor Q4 connects to node N2. The current $I_1$ flows from terminal Vcc through load resistor $R_1$ to node N1. The current $I_2$ flows from terminal Vcc through load resistor $R_2$ to node N2.

Transistors Q5 and Q6 have their control gate electrodes connected to input line Y1, and their drain electrodes connected to the bitline BL(bar) and the bitline BL, respectively; and their source regions are connected to nodes N3 and N4, respectively.

Transistors Q9, Q10, Q13 and Q14 have their drain regions and control gate electrodes connected to potential source Vcc.

Transistors Q9 and Q10 have their source regions connected to nodes N3 and N4 respectively.

Transistors Q13 and Q14 have their source regions connected to nodes N5 and N6 respectively, which in turn are connected to sense terminals S(bar) and S respectively.

Transistors Q11 and Q12 have their source regions connected to reference potential Vss, their drain regions connected to nodes N5 and N6 respectively and their control gate electrodes connected to nodes N3 and N4 respectively.

Transistors Q7 and Q8 have their drain regions connected to nodes N3 and N4 respectively, their control gate electrodes connected to line W(bar) and line W respectively, and their source regions connected to node N7.

The drain region of transistor Q15 connects to node N7 and its source region connected to Vss (ground potential.)

Charge Nodes

Figure 2:
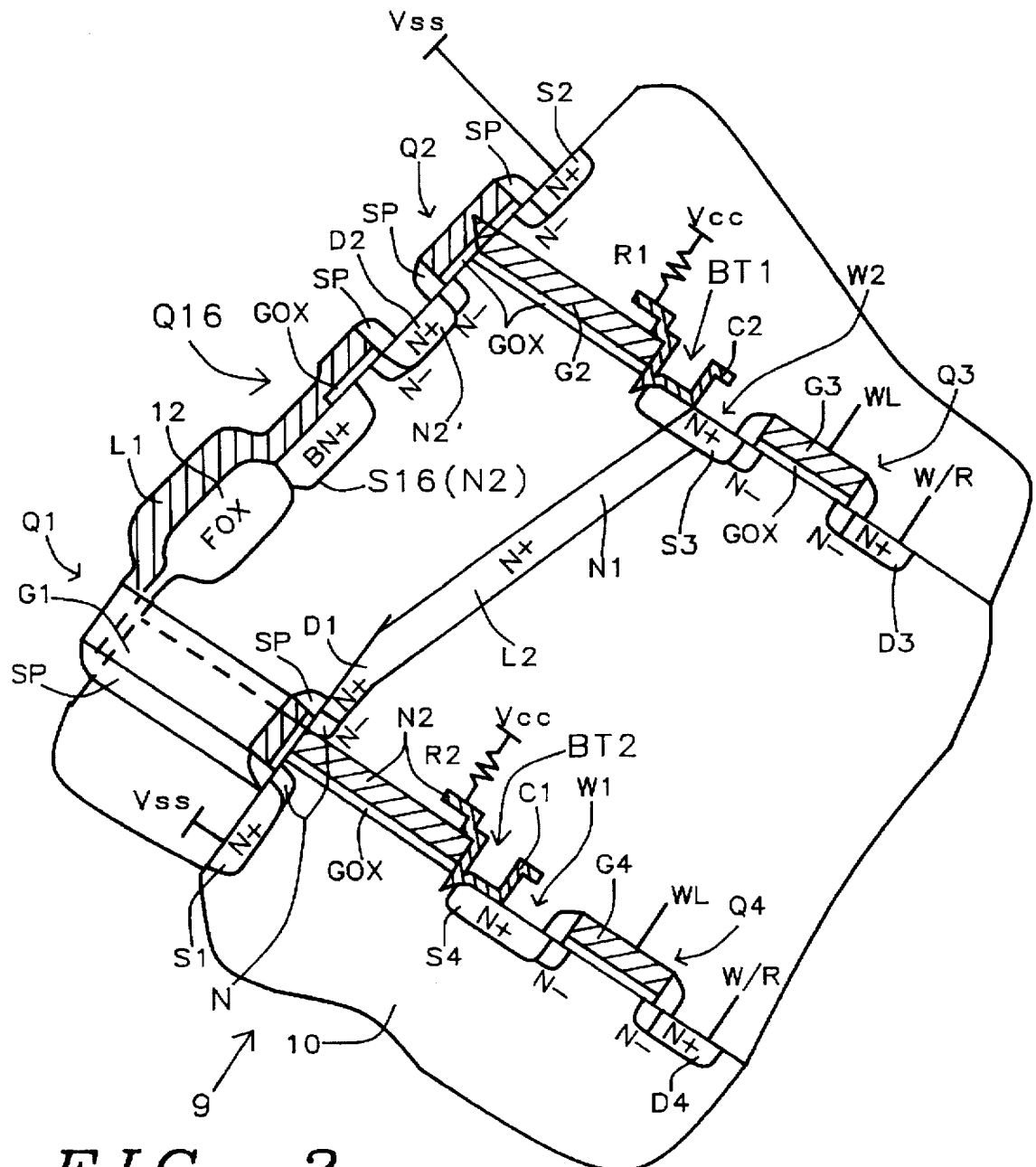
FIG. 2 shows a modified perspective view of a semiconductor device in accordance with the circuit of FIG. 1 with several cross sectional views of a four transistor (4T') polysilicon load cell which is incorporated in FIG. 1 formed on a P-type well in the device. The modified perspective view is provided for convenience of illustration of the various layers and structures in a single drawing.

Transistor Q16 connects a pair of charge nodes N2, and N2' and combined with butted contacts C1 and C2 (as seen in FIG. 2), links polysilicon load resistor R1, a transistor Q4, and transistor Q1, (polysilicon load resistor R2, and transistor Q3, and transistor Q2) N2 (N1) to overcome the problem of buried contacts in trenches. This structure is achieved without any extra processing steps in an SRAM manufacturing process.

Butted contact C1 links polysilicon load resistor R2, the source region S4 of transistor Q4 and the control gate electrode G1 of transistor Q1. Butted contact C2 links polysilicon load resistor R1 to control gate electrode G2 and provides connections through the source region S3 of transistor Q3 to node N1 to the control gate electrode of transistor Q2 and via node N1 to the drain region D1 of transistor Q1.

The doped second polysilicon layer (sometimes referred to in the art as poly-2) formed above the level of the control gate electrodes fills the trenches of any buried contact which exists.

The result is that a butted contact structure connects pass transistor Q3 (transistor Q4) pull down transistor Q2 (transistor Q1), and polysilicon load resistor R1 (R2). Therefore, the issue of trench buried contacts has been exactly overcome.

Using a saturated mode transistor Q16 to connect $POCl_3$ junction, and drain junction of transistor Q2 makes it possible to create a trench free link.

The $POCl_3$ junction is located at N2 in FIG. 1 and at the BN+ region in FIG. 2.

If the objective is to set the node N1 to be "L" (LOW]), and node N2 be "H" (HIGH), the saturated mode transistor Q16 can be turned ON such that the node N2' can charge to "H". Thus operation is satisfactory.

If the objective is to set node N1 to be "H", and node N2 be "L", the node N2' is pulled down to reference voltage Vss due to transistor Q2 being ON, and the node N2 is pulled down to reference voltage Vss because bit line BL is "L". Thus, that operation is also satisfactory.

A particularly advantageous feature of this invention is that this saturated mode transistor Q16 is composed of one $POCl_3$ junction as drain region where the polysilicon interconnection line L1 (in FIG. 2) mask has a positive extension (<0.2 μm) with buried contact and conventional N+ junction as source region.

Considering the $POCl_3$ junction, the effective control gate electrode length is less than 0.05 μm, which permits a very small voltage to keep it ON. Thus, the nodes N2 and N2' can always have equivalent voltages (nearly equal voltage) which means the transistor Q16 link creates a trench free process without influencing the SRAM cell operation. This new cell structure overcomes the trench issues of buried contacts in SRAM process without requiring extra process steps in the manufacture of the cell.

SRAM READ/WRITE FUNCTION

Read Operation

Assume that a charge has been previously stored setting the cell to a one "1" condition, which means the charge on node N1 is stored "H" (high), and the charge on node N2 is stored "L" (low).

The inputs on lines W, W(bar) and WE are all off so the transistors Q15, transistor Q7, transistor Q8 are all turned OFF as is done when the circuit is set for READing the cell 4T.

The current flows from supply voltage Vcc through the S/D circuits of transistor Q10, transistor Q6, and transistor Q4 through node N2, through transistor Q16 through node N2' and through transistor Q2 to reference voltage Vss. Therefore, the node 4 is pulled down to reference voltage Vss such that the transistor Q12 is OFF and transistor Q14 is ON. The output at sense terminal S connected to node N6 senses a one "1".

At the same time, the node N3 is pulled up to supply voltage Vcc because the transistors Q9, Q5, and Q3 are ON while the transistor Q1 is OFF. Therefore, the transistor Q11 is ON because the voltage at node N3 has been pulled up.

The result is that the sense terminal S(bar) senses a zero "0". Accordingly the correct signals are read at both of the terminals S and S(bar).

Write Operation

To write a one "1" into the cell a positive input is supplied to input line X1 connected to the control gate electrode of transistor Q3 (and transistor Q4) and a positive input is supplied on input line Y1 connected to the control gate electrodes of transistors Q5 and Q6. The control gate electrode of transistor Q15 connects to read/write input WE. The control gate electrode of transistor Q8 connects to input W. The control gate electrode of transistor Q8 connects to input W(bar). Setting WE=1, and W=1, and W(bar)=0 respectively turns the transistor Q15 ON, turns transistor Q8 ON and turns transistor Q7 OFF. As a result, the node 4 is pulled down to reference voltage Vss through the S/D circuits of transistor Q8 and transistor Q15. The bit line BL is pulled low by node N4 through the S/D circuit of transistor Q6 so that the charge node N2 is pulled down to a low "L" potential. At the same time, the node 3 is pulled up to supply voltage Vcc through transistor Q9.

Therefore, the result is that the bit line BL(bar) is at a high potential "H", since the node N3 which connects through the S/D circuit of transistor Q5, such that the charge node N1 is high "H". Thus a one "1" is written into the cell, which is the correct result.

There are write W and W(bar) inputs, address X1 and Y1 inputs (including word lines X1).

FIG. 2 shows a modified perspective view of a semiconductor device 9 in accordance with the circuit of FIG. 1 with several cross sectional views of the four transistor (4T) polysilicon load cell which is incorporated in FIG. 1 formed on a P-type well 10 in device 9. The modified perspective view is provided for convenience of illustration of the various layers and structures in a single drawing.

In FIG. 2, transistor Q1 includes the control gate G1 formed from the first polysilicon layer above a gate oxide layer GOX with source region S1 formed of an N+ region on the left of gate G1 connected to reference potential Vss. The drain region D1 of transistor Q1 connects to node N1 which is formed as a portion of the N+ doped region L2 in the P-type well 10 on which the device is formed. Note that the doped region L2 is the connection line from node N1 to drain region D1. The first polysilicon layer is doped with P31 dopant with a dose between about $1 \times 10^{15}$ atoms/cm² and about $5 \times 10^{15}$ atoms/cm².

Transistor Q2 includes the control gate G2 (formed from the first polysilicon layer) above a gate oxide layer GOX with source region S2 formed of an N+ region on the right of gate G2 in FIG. 2 connected to reference potential Vss. The source of transistor Q16 is a buried N+ region S16 below the right end of line L1 which serves as the control gate electrode of transistor Q16. The drain region D2 of both transistors Q2 and Q16 comprises node N2' which is formed as an N+ doped region in the P-type well 10 on which the device 9 is formed. The elongated control gate G2 of transistor Q2 connects by a butting connection (node N1) to contact C2 which extends through a window W2 above source regions S3 down into contact with source region S3 of transistor Q3.

Transistor Q3 includes the control gate G3 (formed from the first polysilicon layer) above a gate oxide layer GOX with source region S3 formed of an N+ region on the left of gate G3 connected to Node N1 and drain region D3 connected to W/R line. Control gate G3 connects to line WL.

Transistor Q4 includes the control gate G4 (formed from the first polysilicon layer) above a gate oxide layer GOX connected to line WL. The source region S4 is formed of an N+ region on the left of gate G4 connected to buried contact C1. Drain D4 is formed of an N+ region located in the P-type well 10 to the right of gate G4. The drain region D4 connects to line W/R. The control gate G1 connects by a butting connection to contact C1 which extends through window W1 above source region S4 down into contact with source region S4 of transistor Q4.

The load resistor R1 connects at node N1 from the voltage supply Vcc to the buried contact C2 to source region S3 and to line L1 which extends over FOX region 12. The FOX region 12 is located between the drain D1 and the buried bit line BN+.

The load resistor R2 connects at node N2 from the voltage supply Vcc to the buried contact C1 and source region S4.

Figure 3A:
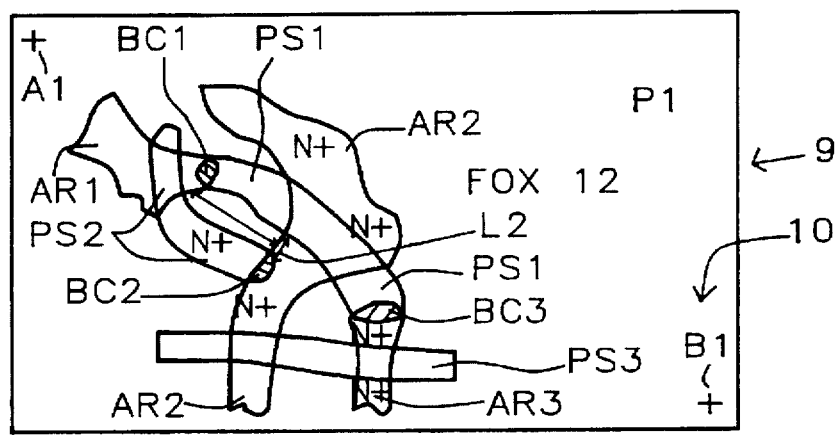
FIGS. 3A–3C shows a series of superimposed plan views of a fragment of the device of FIG. 2.
Figure 3B:
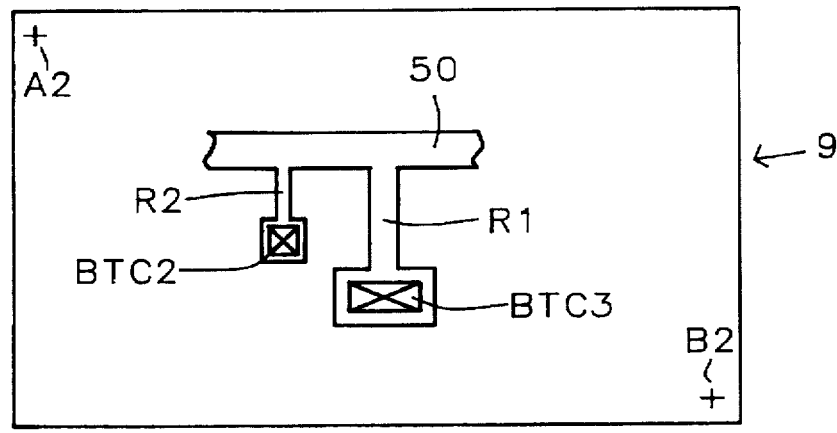
Figure 3C:
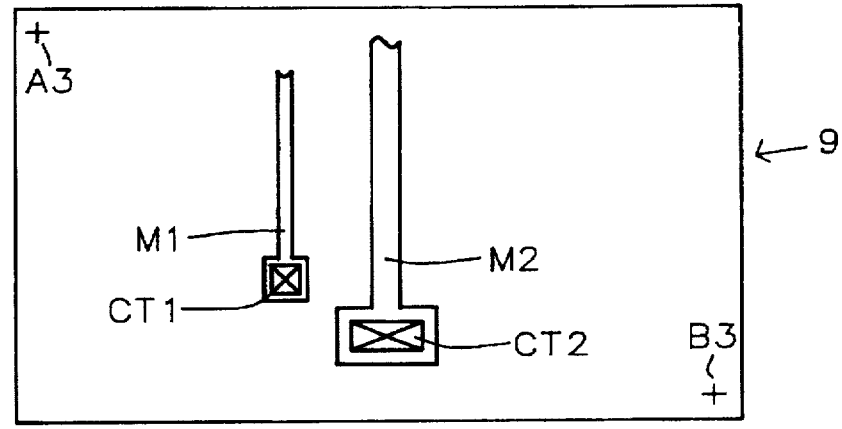

FIGS. 3A–3C shows a series of superimposed plan views of a fragment of the device of FIG. 2.

FIG. 3A shows a plan view of a fragment of the device 9 of FIG. 2 in the area of FOX region 12, showing the pattern of FOX region 12 at the end of gate G1 which is nearer to line L2. The active regions AR1, AR2 and AR3 formed in the semiconductor P-type well 10 are shown. Polysilicon structures PS1, PS2 and PS3 are shown. Polysilicon structure PS1 extends over active region AR2 between buried contact BC1 and buried contact BC3, which connects down to active region AR3 in the semiconductor P-type well 10. Polysilicon structure PS2 extends from above active region AR1 to buried contact BC2 which connects to active region AR2. Between polysilicon structure PS2 and PS1 in active region AR2 is formed line L2. Between active region AR1 and active region AR2 on the surface of the semiconductor P-type well 10 is formed FOX region 12 of FIG. 2. FOX region 12 is also located between polysilicon structures PS1 and PS2. There are index marks A1 and B1 on FIG. 3A, which indicate the relationship of FIG. 3A to FIGS. 3B and 3C which show layers of material formed above the structure shown in FIG. 3A with the structure of FIG. 3B overlying the structure of FIG. 3A. In turn the structure of FIG. 3C overlies the structure of FIG. 3B.

In FIG. 3B, the two resistors R1 and R2 of FIG. 1 and FIG. 2 are shown connected to line 50 which connects to power supply Vcc as shown in FIGS. 1 and 2. At the other end thereof the resistor R2 connects via butted contact BTC2 down to the buried contact BC2 in FIG. 3A. At the other end of resistor R1, resistor R1 connects via butted contact BTC3 down to the buried contact BC3 in FIG. 3A.

In FIG. 3C, metallization lines M1 and M2 are shown terminating at the ends with pads. The pad of line M1 connects by a butted contact CT1 from the pad of line M1 down to active region AR2. The pad of line M2 connects by a butted contact CT2 from the pad of line M1 down to active region AR3.

The source region and drain regions are doped with arsenic (As) dopant with a dose between about $1 \times 10^{15}$ atoms/cm$^2$ and about $5 \times 10^{15}$ atoms/cm$^2$. Adjacent to the source regions and drain regions are conventional N- lightly doped regions.

FIGS. 4A–4D illustrate the process of formation of a high resistance load resistor 106 (R1 or R2) on a device 100 in accordance with this invention.

Figure 4A:
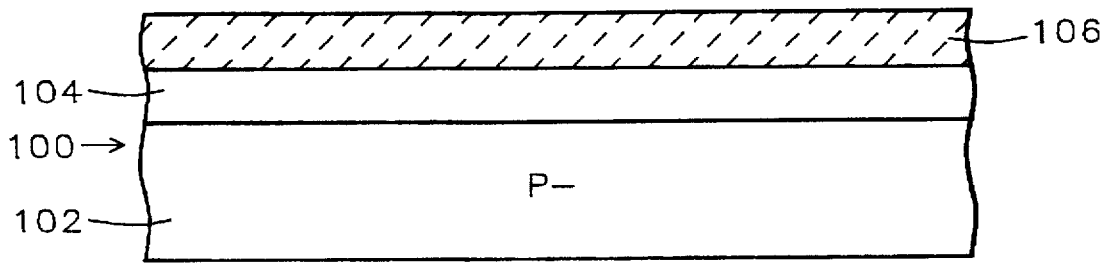
FIGS. 4A–4D illustrate the process of formation of a high resistance load resistor for this invention.

Referring to FIG. 4A, the device 100 is formed on a P-doped substrate 102 (which could be well 10) is coated with an IPO (Inter Polysilicon Oxide) layer 104 such as an ONO (silicon dioxide/silicon nitride/silicon dioxide) or ON (silicon dioxide/silicon nitride).

Above the layer 104 is formed a layer of undoped polysilicon 106.

Figure 4B:
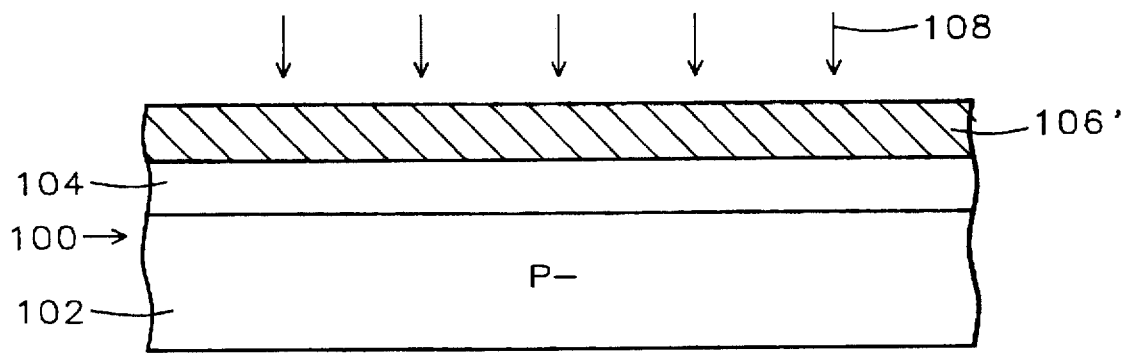

In FIG. 4B, the undoped polysilicon layer 106 on device 100 is being doped by load implant ions 108 in a low dose providing a high resistivity, doped, polysilicon resistor layer 106' as seen in FIG. 4B.

Figure 4C:
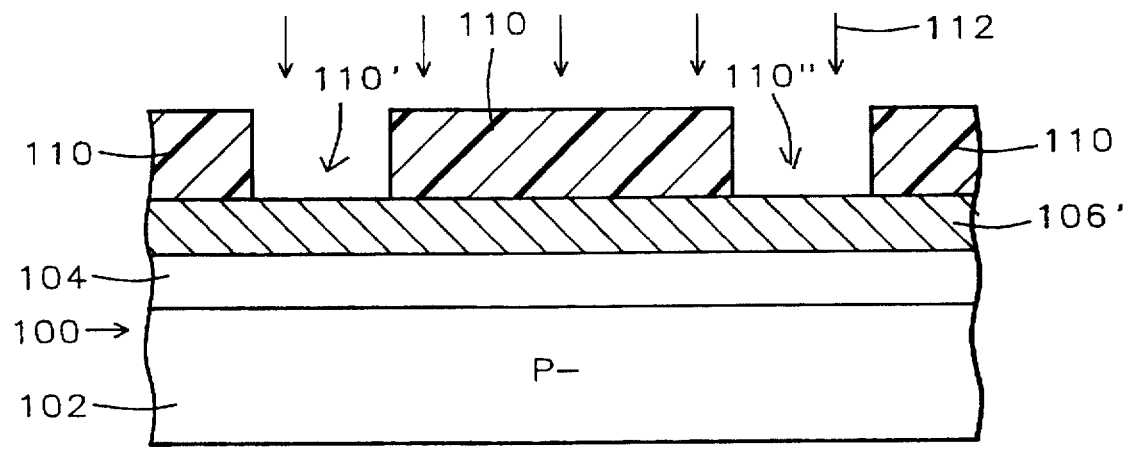
Figure 4D:
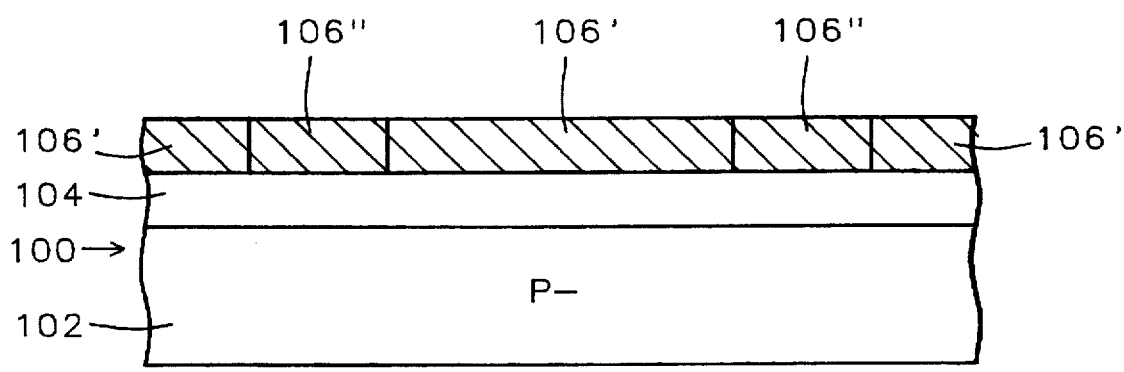

In FIG. 4C, the undoped polysilicon layer 106 on device 100 has been covered with a mask 110 with interconnection openings 110' and 110" over locations in resistor layer 106' where interconnection regions are to be formed therein. In addition, the device is being ion implanted through openings 110' and 110" to form interconnection regions 106" and 106" as seen in FIG. 4D in resistor layer 106'.

The process of this invention follows the conventional process of forming a four transistor (4T) SRAM device.

After the deposition of polysilicon to form the gate electrodes, the P$^{31}$ impurity is diffused into the substrate by thermal treatment.

The buried BN+ region S16 is formed by doping with POCl$_3$. The BN+ region S16 connects to drain D2 as, i.e. when, the gate electrode of transistor Q16 is forced to a high voltage.

This is a trench free process since no current path is cut by etching.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An SRAM transistor cell on a doped semiconductor substrate comprising:

a first pass transistor and a second pass transistor, each having a source region, a drain region and a control gate electrode, a first driver transistor and a second driver transistor each having a source region, a drain region and a control gate electrode, a saturated mode transistor having a source region, a drain region and a control gate electrode, a first load resistor having first and second ends and a second load resistor having third and fourth ends, said first end being connected to said third end, a first node being connected to said second end of said first load resistor, a second node being connected to said fourth end of said second load resistor, and a third node, a bit line and a bit line bar, first and second interconnection lines, said first driver transistor having the drain region thereof connected to said first node and the control gate electrode cross-connected via said first interconnection line to said second node, said second driver transistor having the drain region thereof connected to said third node and the control gate electrode cross-connected via said second interconnection line to said first node, said control gate electrodes of said pass transistors being connected to a single input line, said drain region of said first pass transistor being connected to said first node, said drain region of said second pass transistor being connected to said second node, said source region of said first pass transistor being connected to said bit line bar, said source region of said second pass transistor being connected to said bit line, and the drain region and control gate electrode of said saturated mode transistor being connected to said second node and the source region of said saturated mode transistor being connected to said third node.

2. An SRAM transistor cell in accordance with claim 1 wherein said saturated mode transistor has an effective gate length<0.05 μm.

3. An SRAM transistor cell in accordance with claim 1 wherein all of said control gate electrodes are formed from a first layer of polysilicon.

4. An SRAM transistor cell in accordance with claim 3 wherein at said first node said first resistor is connected through a second polysilicon layer forming a buried contact to said source region of said first pass transistor and forming a butting contact to said control gate electrode of said second driver transistor.

5. An SRAM transistor cell in accordance with claim 3 wherein at said second node said first resistor is connected through a second polysilicon layer forming a buried contact to said source region of said second pass transistor and forming a butting contact to said control gate electrode of said first driver transistor.

6. An SRAM transistor cell in accordance with claim 4 wherein at said second node said first resistor is connected through a second polysilicon layer forming a buried contact to said source region of said second pass transistor and forming a butting contact to said control gate electrode of said first driver transistor.

7. An SRAM transistor cell in accordance with claim 1 wherein:

said saturation mode transistor is formed by a $POCl_3$ junction as drain region where the pattern of a first polysilicon layer has a positive extension with a buried contact to said substrate and a source region.

8. An SRAM transistor cell in accordance with claim 2 wherein:

said saturation mode transistor is formed by a $POCl_3$ junction as drain region where the pattern of a first polysilicon layer has a positive extension less than about 0.2 μm with a buried contact to said substrate and a source region.

9. An SRAM transistor cell in accordance with claim 3 wherein:

said saturation mode transistor is formed by a $POCl_3$ junction as drain region where the pattern of a first polysilicon layer has a positive extension less than about 0.2 μm with a buried contact to said substrate and a source region.

10. An SRAM transistor cell in accordance with claim 4 wherein:

said saturation mode transistor is formed by a $POCl_3$ junction as drain region where the pattern of a first polysilicon layer has a positive extension less than about 0.2 μm with a buried contact to said substrate and a source region.

11. An SRAM transistor cell formed on a P-doped semiconductor substrate comprising:

a first pass transistor and a second pass transistor, each having a doped source region in said substrate, a doped drain region in said substrate, and a control gate electrode formed from a first polysilicon layer formed on a gate oxide layer on said substrate, a first driver transistor and a second driver transistor each having a doped source region in said substrate, a doped drain region in said substrate, and a control gate electrode formed from said first polysilicon layer formed on a gate oxide layer on said substrate, a saturated mode transistor having a doped source region in said substrate, a doped drain region in said substrate, and a control gate electrode formed from said first polysilicon layer formed on a gate oxide layer on said substrate, a first polysilicon load resistor having first and second ends and a second polysilicon load resistor having third and fourth ends, said first end being connected to said third end, a first node being connected to said second end of said first load resistor, a second node being connected to said fourth end of said second load resistor and a third node, a bit line and a bit line bar, first and second interconnection lines, said first driver transistor having the drain region thereof connected to said first node and the control gate electrode cross-connected via said first interconnection line to said second node, said second driver transistor having the drain region thereof connected to said third node and the control gate electrode cross-connected via said second interconnection line to said first node, said control gate electrodes of said pass transistors being formed from a first polysilicon layer and said control gate electrodes of said pass transistors being connected to a single input line, said drain region of said first pass transistor being connected to said first node, said drain region of said second pass transistor being connected to said second node, said source region of said first pass transistor being connected to said bit line bar, said source region of said second pass transistor being connected to said bit line, and the drain region and control gate electrode of said saturated mode transistor being connected to said second node and the source region of said saturated mode transistor being connected to said third node.

12. An SRAM transistor cell in accordance with claim 11 wherein said saturated mode transistor has an effective gate length<0.05 μm.

13. An SRAM transistor cell in accordance with claim 11 wherein all of said control gate electrodes are formed from a first layer of polysilicon doped with phosphorus (P31) with a dose between about $1 \times 10^{15}$ atoms/cm$^2$ and about $5 \times 10^{15}$ atoms/cm$^2$.

14. An SRAM transistor cell in accordance with claim 13 wherein at said first node said first resistor is connected through a second polysilicon layer forming a buried contact to said source region of said first pass transistor and forming a butting contact to said control gate electrode of said second driver transistor.

15. An SRAM transistor cell in accordance with claim 13 wherein at said second node said first resistor is connected through a second polysilicon layer forming a buried contact to said source region of said second pass transistor and forming a butting contact to said control gate electrode of said first driver transistor.

16. An SRAM transistor cell in accordance with claim 14 wherein at said second node said first resistor is connected through a second polysilicon layer forming a buried contact to said source region of said second pass transistor and forming a butting contact to said control gate electrode of said first driver transistor.

17. An SRAM transistor cell in accordance with claim 11 wherein said saturation mode transistor is formed by a POCl$_3$ junction formed by doping with phosphorus (P31) with a dose greater than about $1 \times 10^{15}$ atoms/cm$^2$ as a drain region where the pattern of a first polysilicon layer has a positive extension with a buried contact to said substrate and a source region.

18. An SRAM transistor cell in accordance with claim 12 wherein said saturation mode transistor is formed by a POCl$_3$ junction formed by doping with phosphorus (P31) with a dose greater than about $1 \times 10^{15}$ atoms/cm$^2$ as a drain region where the pattern of a first polysilicon layer has a positive extension less than about 0.2 μm with a buried contact to said substrate and a source region.

19. An SRAM transistor cell in accordance with claim 13 wherein said saturation mode transistor is formed by a POCl$_3$ junction formed by doping with phosphorus (P31) with a dose greater than about $1 \times 10^{15}$ atoms/cm$^2$ as a drain region where the pattern of a first polysilicon layer has a positive extension less than about 0.2 μm with a buried contact to said substrate and a source region.

20. An SRAM transistor cell in accordance with claim 14 wherein said saturation mode transistor is formed by a POCl$_3$ junction as drain region where the pattern of a first polysilicon layer has a positive extension less than about 0.2 μm with a buried contact to said substrate and a source region.

* * * * *